United States Patent
Krassnitzer et al.

(10) Patent No.: US 12,398,457 B2
(45) Date of Patent: Aug. 26, 2025

(54) CATHODIC ARC SOURCE

(71) Applicant: OERLIKON SURFACE SOLUTIONS AG, PFÄFFIKON, Pfäffikon SZ (CH)

(72) Inventors: Siegfried Krassnitzer, Feldkirch (AT); Jürg Hagmann, Sax (CH); Andreas Peter Treuholz, Bad Ragaz (CH)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 752 days.

(21) Appl. No.: 17/597,246

(22) PCT Filed: Jul. 3, 2020

(86) PCT No.: PCT/EP2020/068828
§ 371 (c)(1),
(2) Date: Dec. 30, 2021

(87) PCT Pub. No.: WO2021/001536
PCT Pub. Date: Jan. 7, 2021

(65) Prior Publication Data
US 2022/0307125 A1    Sep. 29, 2022

(30) Foreign Application Priority Data
Jul. 3, 2019    (CH) ..................... 00877/19

(51) Int. Cl.
*C23C 14/34* (2006.01)
*C23C 14/00* (2006.01)
(Continued)

(52) U.S. Cl.
CPC ...... *C23C 14/3407* (2013.01); *C23C 14/0021* (2013.01); *C23C 14/0641* (2013.01);
(Continued)

(58) Field of Classification Search
CPC ............ C23C 14/3407; C23C 14/0021; C23C 14/0641; C23C 14/325; C23C 14/351;
(Continued)

(56) References Cited

U.S. PATENT DOCUMENTS 5,279,723 A * 1/1994 Falabella ............... H01J 27/022
                                                      313/157
5,861,088 A   1/1999 Curtins
(Continued)

FOREIGN PATENT DOCUMENTS

DE    4000941 A1    8/1990
DE    4329155 A1    3/1995
(Continued)

OTHER PUBLICATIONS

International Search Report for PCT/EP2020/068828 dated Sep. 16, 2020.
Written Opinion for PCT/EP2020/068828 dated Sep. 16, 2020.

*Primary Examiner* — Rodney G McDonald
(74) *Attorney, Agent, or Firm* — McDonald Hopkins LLC

(57) ABSTRACT

A cathodic arc evaporation apparatus including
a target which has a target surface including an active surface from where material can be evaporated in a cathodic arc process;
a confinement surrounding an outer border of the target surface;
an anode having an electron receiving surface, the anode encompassing at least one of the target and the confinement in at least one of a target plane and an axial distance in front of the active surface; and
a magnetic guidance system adapted to provide a magnetic field at the target surface being essentially in parallel to at least an outer region of the target surface so that magnetic field lines are in parallel to the target surface or inclined to it in an acute angle α, whereat an
(Continued)

Figure 1:
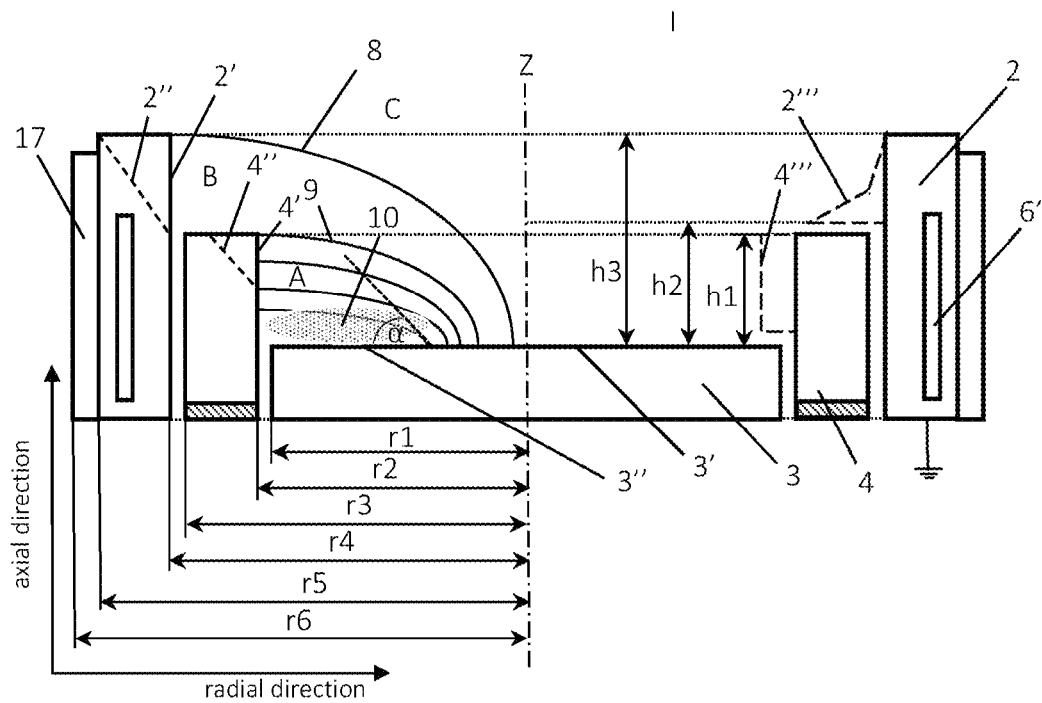

active surface is defined in a surface area where magnetic field lines enter the target surface in an acute angle $\alpha \leq 45°$.

26 Claims, 2 Drawing Sheets

(51) Int. Cl.
    *C23C 14/06*     (2006.01)
    *C23C 14/32*     (2006.01)
    *C23C 14/35*     (2006.01)
    *H01J 37/32*     (2006.01)
    *H01J 37/34*     (2006.01)

(52) U.S. Cl.
    CPC .......... *C23C 14/325* (2013.01); *C23C 14/351* (2013.01); *H01J 37/32055* (2013.01); *H01J 37/34* (2013.01); *H01J 37/345* (2013.01)

(58) Field of Classification Search
    CPC ............ C23C 14/0617; C23C 14/0676; C23C 14/081; C23C 14/083; H01J 37/32055; H01J 37/34; H01J 37/345; Y02E 30/10
    USPC ........................................ 204/192.38, 298.41
    See application file for complete search history.

(56) References Cited

U.S. PATENT DOCUMENTS

| | | | |
|---|---|---|---|
| 6,207,028 B1 * | 3/2001 | Haas | H01J 37/3423 |
| | | | 204/298.18 |
| 2003/0094362 A1 | 5/2003 | Gstoehl et al. | |
| 2004/0222745 A1 | 11/2004 | Chistyakov | |

FOREIGN PATENT DOCUMENTS

| | | |
|---|---|---|
| DE | 10250941 A1 | 5/2003 |
| EP | 1382711 A1 | 1/2004 |
| EP | 2586888 A1 | 5/2013 |
| WO | 8901699 A1 | 2/1989 |
| WO | 2011021281 A1 | 2/2011 |
| WO | 2011160766 A1 | 12/2011 |
| WO | 2019081053 A1 | 5/2019 |

* cited by examiner

CATHODIC ARC SOURCE

The invention refers to a cathodic arc evaporation apparatus, to a method to deposit a hard coating on a substrate and to a method to produce a coated substrate.

TECHNICAL BACKGROUND

Cathodic arc evaporation apparatuses, here also referred to as arc sources or arc evaporation sources, are well known in the field of physical vapor deposition (PVD) as the work horse for a large number of various surface treatments and coating deposition processes especially in the field of tool coating and to a certain degree also in the field of the coating of components. However despite of the broad range of application, there are still some inherent drawbacks with state of the art sources which are a high heat load which is transmitted from the surface of the arc source to the substrate, as well as a high density of "particles" that are commonly called "droplets" or "macro-particles", which may occur when an arc gets stuck (in other words, when the arc spot remains so long on the a point of the target surface to be evaporated that target material from the target surface melts without possibility of a proper evaporation and subsequent ionization), which often, especially on metallic surfaces, results in melting pools which evaporate in an explosive way forming so called droplets having a size of up to some micrometers which can be found on the substrate surface and in the coating.

Up to now, only filtered arc sources seam to solve both problems, however such arc sources due to their complicated magnetic set-up are very expensive and have lost most of the benefits of conventional arc sources which are high productivity in terms of coating rate and robust and easy to handle processing.

There have been some promising developments with another source type, the so called steered arc source, where the arc is confined to the surface by a static or dynamic magnetic field and caused to move in a specific path and with a greater velocity than with the random arc. Krassnitzer et al propose in WO 2011/160766 A1 an arc source as shown in FIG. 5, for making possible to produce layers with low surface roughness at a constantly high evaporation rate, the arc source comprising a cathode (target), an anode and magnetic means that enable the magnetic field lines to lead from the target surface to the anode in a short connection. In this manner it is attained that the behavior of the potential in front of the substrate is no longer distorted, since the electron temperature of such a plasma is merely approx. 0.3 eV to 1 eV.

However, there is still a need of improvement, in particular in relation to attaining a higher reduction of droplet formation in coatings produced by reactive cathodic arc evaporation processes, in which targets made of a material that consists of or comprises a big proportion of chemical elements having a low melting point, such as for example aluminum, need to be evaporated.

OBJECTIVE OF THE PRESENT INVENTION

One of the objectives of the present invention is to provide a new arc source that constitutes a solution for overcoming the above-mentioned problems of the arc sources according to the state of the art. In particular the present invention should provide a new arc source which enables coating of substrates by using reactive cathodic arc deposition techniques in a manner that the heat load on the surface of the substrate to be coated (and consequently the substrate temperature) can be maintained as low as possible but at the same time a further reduction of the size and density of droplets in the coating can be attained.

DESCRIPTION OF THE PRESENT INVENTION

The objective of the present invention is attained by providing an inventive arc source as described below.

An arc source (cathodic arc evaporation apparatus) according to the present invention comprises:
a target as cathode having
  a front-target surface (hereafter also called simply target surface) of a material to be evaporated (the target surface to be evaporated is also called active surface in the present description of the invention—the active surface is then the target surface from which material is evaporated during the cathodic arc evaporation process),
  a back-target surface, parallel to the front-target surface but facing a target back plate placed in the opposite side in relation to the front-target surface, and
  a side-target surface (hereafter also called border or border of the target) connecting the front-target surface with the back-target surface,
an electrical floating confinement member (hereafter also called confinement member or simply confinement or electrical floating arc spot confinement), preferably ring-shaped, however, other configurations are also contemplated, for instance, the confinement member can be square-shaped or rectangular shaped, wherein the confinement member is located adjacent, preferably surrounding or at least partially surrounding (but without directly contacting) the side-target surface, in particular, the confinement is placed surrounding an outer border of the target surface (that means in particular that the confinement is located surrounding a surface of the border of the target which is next to the front-target surface), the electrical floating confinement member comprising an inner surface and an outer surface, wherein the side-target surface is closer to the inner surface of the confinement member than to the outer surface of the confinement member.
an electrode as anode having an inner surface for acting as electron receiving surface,
magnetic fields generating means (hereafter also called a magnetic guidance system or simply magnetic means) adapted to provide magnetic fields comprising magnetic field lines located in front of the front-target surface,
wherein:
the inner surface of the confinement member is placed:
  between the front-target surface and the electron receiving surface of the anode, if the distance in a perpendicular plane in relation to the front-target surface is considered, and/or
  between the side-target surface and the electron receiving surface of the anode, if the distance in a parallel plane in relation to the front-target surface is considered, and
the magnetic fields generating means designed and adjusted for producing at least following two magnetic fields regions:
  a first region comprising magnetic field lines located in front of the front-target surface which exit the front-target surface and end in the inner surface of the confinement member, and a second region comprising magnetic field lines located in front of the front-target surface which exit the front-target surface and end in the electron receiving surface of the anode, thereby enabling that three plasma zones or plasma regions can be produced, when the arc source is operated within a vacuum chamber, wherein:

a first plasma zone (plasma zone A or light plasma zone A or high electron temperature plasma zone A) comprises electrons crossing the magnetic fields without having access to the anode, because of the magnetic field lines that exit the front-target surface and end in the inner surface of the confinement member, a second plasma zone (plasma zone B or dark plasma zone B or low electron temperature plasma zone B), in which electrons are drifted to the anode by the magnetic field lines that exit the front-target surface and end in the electron receiving surface of the anode, hereby closing a primary circuit, and a third plasma zone (plasma zone C or dark plasma zone C or low electron temperature plasma zone C), in which there are not any magnetic field lines which neither exit the front-target surface and end in the inner surface of the confinement member nor exit the front-target surface and end in the in the electron receiving surface.

In this manner, with the inventive arc source a surprisingly a big improvement was attained, which involves following three advantages at the same time:

a reduced electron temperature in the plasma zones B and C and consequently a reduced electron temperature of the plasma surrounding the substrates to be plasma treated or coated (normally plasma zone C), this resulting in a reduced heat load to the substrate, which favors:

coating or plasma treatment of substrates made of or comprising temperature sensitive materials, formation of coating materials which require a low temperature for the corresponding synthesis, a reduced ionization of reactive gas in the zones B and C and consequently a reduced quantity of reactive gas ions (e.g. if nitrogen is used as reactive gas, then a reduced quantity of gas ions $N^+$ and $N^{2+}$) which results in the possibility of synthesis of coating materials, whose synthesis id promoted by a reduction or absence of reactive gas ions.

a considerable reduction of size and quantity of droplets in the coating, resulting from the increased plasma density of reactive gas ions in the plasma zone A, because the reactive gas ions react with the material of the front-target surface, causing a change in the state of the front-target surface material (e.g. if the material of the front-target surface is a metal or semi-metal and nitrogen is used as reactive gas, then the gas ions $N^+$ and $N^{2+}$ react with the metal or semi-metal of the front-target surface causing a nitration of the front-target surface material in such a manner that smaller droplets and/or less droplets are produced (e.g. if the target material is Ti or Al or AlTi and nitrogen is the reactive as, then during nitriding of the front-target surface a nitriding layer of TiN or AlN or AlTiN is formed, resulting in an increased steering speed of the arc spot running on the nitride layer, a diminution of the evaporation rate of the front-target surface material and less emission of droplets, hereby depositing a coating on a substrate placed in the zone C, which exhibits a lower roughness (i.e. has smoother surface).

DEFINITIONS

The term cathodic arc evaporation apparatus is used synonymously with the term arc source and likewise with the term arc evaporation source in the present application.

Radial ($r_1, \ldots r_n$) and axial ($h_1, \ldots h_n$) distances as well as the terms higher and lower and respective equivalents are, unless stated otherwise, used with reference to schemes of the arc source as shown in the figures. The terms inner and outer, unless stated otherwise, are used with reference to the axis or central line Z of the arc source, where Z defines the innermost position. Man of the art however knows that arc sources can be arranged in any position of a vacuum chamber that means at the bottom, at the side of the vacuum chamber or overhead (not shown) and therefor will interpret this terms respectively to the arc source as shown in the figures.

Surprisingly it could be shown that inventive arc sources can be used also to deposit compound compositions further away from a state of thermodynamic equilibrium than it could be provided with sources known from the state of the art, which hereby is a further subject of the invention.

More details and preferred embodiments of cathodic arc evaporation apparatus according the present invention as well as methods in which at least one inventive cathodic arc evaporation apparatus are used, will be explained in more detail below.

In a preferred embodiment of a cathodic arc evaporation apparatus according to the present invention, the apparatus comprises a target which has a target surface (above called front-target surface) comprising an active surface (above called surface to be evaporated) from where material can be evaporated in a cathodic arc process;

a confinement surrounding an outer border of the target surface, whereat the confinement can be a single piece body or a confinement body composed from several confinement elements;

an anode having an electron receiving surface, the anode encompassing at least one of the target and the confinement in at least one of a target plane and an axial distance in front of the active surface;

a magnetic guidance system adapted to provide a magnetic field at the target surface being essentially in parallel to at least an outer region of the target surface which may comprises at least 50%, or 70%, or even 90% and more of the target surface. Essentially in parallel in this context has the meaning that the magnetic field lines are in parallel or inclined to the target surface in an acute angle $\alpha \leq 45°$, or $\alpha \leq 30°$, or even $\alpha \leq 25°$, whereby an active surface area is defined. It should be mentioned that effects as electron trapping and the like as described in detail below will increase with a higher degree of the parallelism of the magnetic field at the target surface and near above, e.g. in zone A, see also below;

a central axis Z for circular arc sources or a central plane Z' for polygonal, e.g. rectangular arc sources;

1 The confinement and the anode both are made preferably in closed geometry, e.g. as a ring or a polygon like a rectangle or the like, and both are electrically isolated against each other and the target, whereat the minimum distance of the electron receiving surface from the active surface is defined by at least one of the following geometric parameters: a radial distance $\Delta r_{14}$ of an outer border of the target surface to an inner border of the electron receiving surface, whereby the outer border of the target surface has a radial distance r1 from the middle of the target and the inner border of the electron receiving surface has a radial distance r4 from the middle of the target, and an axial distance h1 or h2 from the target surface to an upper border of the confinement or a lower border of the electron receiving surface. This distance can be seen as the axial effective distance with reference to the increase of the discharge voltage of the arc source.

Thereby a high plasma density can be achieved during a cathodic arc process in front of the outer region of the target. Due to the essential surface parallel magnetic field and a floating potential which is formed at the isolated confinement, the great part of the impinging electrons bounce back into the high density plasma where they are trapped and forced to a circular movement similar to the racetrack of a sputter target. Only when electrons escape over the outermost magnetic field line which still enters the confinement at axial distance h1 and radial distance r4, electrons will, due to a still considerable magnetic field in the region between the electron receiving surface and the target surface be driven towards and neutralized at the anode which is usually on ground potential.

Thereby the essentially parallel magnetic field may extend from the active target surface to at least an axial distance (h1 or h2) of the confinement or the electron receiving surface or may extend at least to a height of 5 to 20 mm above the target surface.

With any embodiment of the present invention a zone A above the active including an essentially parallel magnetic field is provided, wherein the strength of the magnetic flux density $B_A$ can be set from 20 to 500 Gauss or even higher, e.g. about 40 to 60 Gauss at a mid-diameter of a target surface and about 500 Gauss or even higher in close proximity, some few millimeters to a ferromagnetic central limiter, when made use of it. Zone A is sidewise limited by the confinement which also limits the outer border or diameter of the active target surface. To the center of the target, zone A is delimited either by an inactive surface region of the target, where magnetic field lines enter the target surface in an angle >45° or by a central limiter which can have the properties of a magnetic central yoke, as described below. In an axial direction from the target, zone A is delimited by the last magnetic field line which still enters the confinement, which is immediately before the next field line entering the electron receiving surface, e.g. at its lowest or it's innermost border.

The confinement can be made of magnetic or non-magnetic material, e.g. magnetic steels as used for the central limiter, see below, or non-magnetic steels, ceramics or other materials which can bear the high heat load near the active target surface.

A radial distance $\Delta r_{14}$ between the outer diameter of the active target surface and the inner diameter of the electron receiving surface, is from 5 to 30 mm, e.g. 20±5 mm. This distance can be seen as the radial effective distance with reference to the increase of the discharge voltage of the arc source.

The radial distance r1 of the outer border of the target surface from the center of the apparatus is from 80 to 220 mm, e.g. 15±5 mm.

An axial distance (h1 or h2) is from 0 to 20 mm, e.g. 15±5 mm.

The maximum axial distance of the electron receiving surface h3 from the target surface can be: $10 \leq h3 \leq 50$. The magnetic guidance system may comprise at least a central magnet having a pole placed in front of a center of a back surface of the target and being axially aligned to it, and a peripheral ring-magnet having a reciprocal pole in or below a target plane, the ring-magnet in prospect encompasses the central magnet and at least a part of the target, when it overlaps, e.g. when the inner diameter of the ring-magnet is less than the outer diameter of the target, otherwise which is preferable it will encompass the target as a whole.

At least one of the central magnet and the ring-magnet can be an electromagnet or a permanent magnet. When permanent magnets are used the respective magnet can be made from one piece or by an arrangement of permanent magnets, e.g. arranged in a circular arrangement of same polarity with the ring-magnet.

The magnetic axis of the ring magnet can be tilt away from the central axis Z or plane Z' in an upwards direction. Whereas the axis of the central magnet will be usually in the center and parallel to axis Z.

In a further embodiment of the invention the ring-magnet may comprise two electromagnetic coils C2 and C3, whereby the diameter of C3 is larger than the diameter of C2. Such coils can have separate coil yokes or a common coil yoke and can be connected mechanically or merely magnetically to a peripheral yoke, see below.

The magnetic guidance system of any embodiment may further comprise a peripheral yoke encompassing the ring-magnet, the target and the anode, the peripheral yoke being made of magnetizable material, e.g. iron, martensitic steel or similar.

In a further embodiment the magnetic guidance system may further comprise a central limiter arranged in or round the center of the target surface, the central limiter being electrically isolated against the target and made of magnetic material having a Curie-temperature $T_C$>500° C., $T_C$>600° C., or even, $T_C$>650° C. Respective materials may be e.g. pure iron, construction steel having a low carbon content, or ferritic corrosion resistant steel having a Cr content higher 10.5 mass %. Such a central limiter can have a width or diameter of 20 to 50 mm, e.g. from 30 to 40 mm and can be made disc-shaped or ring-shaped for circular targets.

The central limiter may protrude 0 to 20 mm, or 5 to 20 mm above the target surface or even to an axial distance h1 or h2, e.g. when at least one of the confinement and the anode protrudes the target surface.

Alternatively, the central limiter can be in a plane with the target surface. The central limiter may protrude 5 to 20 mm above the target surface or to an axial distance h1 or h2, e.g. when at least one of the confinement and the anode protrude the target surface.

In any embodiment of the invention the confinement can be made of non-magnetic material.

In a further preferred embodiment of the invention the minimum distance of the electron receiving surface from the active surface is defined by the radial distance $\Delta r_{14}$ and the axial distance h1 or h2.

The present invention is also directed to a vacuum chamber comprising a cathodic arc evaporation apparatus as described above.

Further on the invention is also directed to a method to deposit a coating on a substrate in a vacuum chamber by use of a cathodic arc evaporation apparatus as described above, whereat an electron trap is established at least immediately above a target surface within a zone A by applying an essentially parallel magnetic field, with magnetic field lines entering the target surface in an acute angle α≤45°, to at least an outer region of the target surface by use of a magnetic guidance system, whereby an active surface is formed. The method further comprises ignition and maintaining of the cathodic arc discharge on the active surface, whereby arc spots are steered by the parallel component of the radial magnetic field, and zone A is delimited sidewise by a confinement on floating potential which encompasses the target. To the center of the target, zone A can be delimited either by an inactive surface region of the target or by a central limiter. Whereas in an axial direction from the target, zone A can be delimited by the last magnetic field line 9 which enters the confinement at its upper border.

The method may further comprise a formation of a zone B, which is formed above zone A until about a distance h3, given by the maximum axial distance of the electron receiving surface from the target surface. To say it more precisely zone B, from where electrons which could escape from zone A may travel due to a still present magnetic field in a circular pathway towards the anode, begins with the first field line 8' which enters the electron receiving surface, e.g. at its lowest or innermost border which follows immediately after the field line 9 which constitutes the last magnetic field line still entering the confinement at its upper or outermost border, and is delimited in in upwards direction by the last field line 8 which enters the electron receiving surface, e.g. at its highest or outermost border. Both field lines originating from a central magnet or a central limiter. It is obvious that the average magnetic field strength of zone B will be lower than the average magnetic field strength in zone A. Favorably however the field strength and magnetic flux in zone B will be essentially higher than zero, e.g. a flux from 5 to 20 Gauss could be applied, to drive efficiently electrons, which could escape the electron trap from zone A, towards the anode which delimits zone B sidewise. At the anode electrons are discharged and leave the plasma and therefor are not any longer available for further ionization or collision processes which would heat up the process gas or other parts of the vacuum chamber. Therefor the heat load at the anode is essentially higher than with conventional arc sources which however can be managed by direct or indirect water cooling of the anode and use of a highly heat conductive anode material like copper or the like.

Therewith even two- or more part anodes can be used, e.g. an anode having an inner anode ring extension tightly fit to an outer water-cooled anode body, whereat the inner ring can be easily removed or replaced for service purposes. At the same time the heat load at the substrate could be diminished essentially, as on the one hand an intensive brightly shining arc plasma, where a great part of the arriving reactive molecules like nitrogen or oxygen comprising process gases are immediately ionized, is restricted to zone A and does not expand into the vacuum chamber. This brightly shining plasma can have a similar lateral distribution as known from a so called racetrack of a sputter target. Thereby the target surface is completely reacted, e.g. nitrified, oxidized or both if nitrogen and oxygen comprising process gases are used at the same time, whereby, due to the high melting point of such compounds, the undesirable formation of liquid metal pools and their "explosive" evaporation in the arc track can be efficiently suppressed, which otherwise would lead to a high density of disturbing droplets on the surface of the coated substrate. On the other hand, the heat of the electrons is efficiently absorbed by the water cooled anode. Tests measuring the temperature difference of the cooling water of the anode and the targets have shown that more than 80%, more than 90% or even 95% of the process energy fed by the arc sources could be discharged by the respective cooling circuits of target and anode when inventive arc evaporation apparatuses have been used. With conventional arc sources however only 50% to 55% of the heat is discharged by the respective cooling circuits, which means that heat load of the substrate is diminished for about 90% and substrate temperatures between 150° C. and 350° C., especially between 150° C. and 300° C. can be performed without the need of separately cooling the substrates.

The method may further comprise a zone C formed above zone A and B, which is with reference to a deposition process in a vacuum chamber between the arc source and a substrate surface to be coated, wherein the magnetic field is very low or zero and the atmosphere comprises reactive gas molecules and at least one of positively ionized metallic ions and positively ionized reacted metal ions. Optionally the atmosphere may further comprise at least one of inert gas molecules. The rate of ionized reactive gas molecules in zone C is very low or negligible with reference to the high ionization in zone A. Thereby reactive gas molecules and positively ionized metallic ions and/or positively ionized reacted metal ions predominant and can form as an example at least 80%, e.g. 95 or even 99% and more of the reactive atmosphere into which the substrates are submersed.

With the help of the magnetic guidance system and the floating confinement which both act like a plasma resistance, which can be adjusted by the field strength and distance r4, h1 and/or h2 a discharge voltage of the arc source can be raised between 20 V and 50 V, between 25 V and 40 V or between 30 V to 35 V generating a strong ionization of the working gas near the target surface. This is essentially above the discharge voltage of known arc sources, which are usually driven with a discharge voltage from 10 V to 20 V at the maximum.

To summarize by use of an inventive arc source deposition processes can be designed with a high plasma density restricted to a zone A directly above the surface of the substrate whereby a high reaction of the target surface with a reactive process gas can be provided. In zone B electrons can be removed efficiently before they can move out towards the free space in the vacuum chamber. At the same time reactive gas ions coming from zone A may recombine in zone B and/or at the anode surface. Therefor zone C is essentially free of free electrons, i.e. electrons which are not bound to molecules or metal ions, and reactive gas ion concentration is low or near zero. With reference to loaded particles essentially mostly relatively heavy metal ions ($Me^{n+}$) and metal-compound ions, e.g. $MeN^{n+}$ and/or $MeO^{n+}$, can be detected in zone C where they provide the deposition material together with reactive gas molecules which may react on the substrate surface with the incoming metal ions or metal containing ions. Other loaded species as electrons and nitrogen ions are mostly restricted to zones A and B, with a high density in zone A, near the target surface.

Such plasma modification makes the source very appropriate for low temperature deposition of hard coatings and processes to deposit compound compositions far from a state of thermodynamic equilibrium. As an example AlMeN, an AlMeO or an AlMeNO compound of different stoichiometric compositions could be deposited, where Me stands for one or more metals of the transition metal group IV, V or VI (US: group 4b, 5b, 6b), comprising Ti, V, Cr, Zr, Nb, Mo, Hf, Ta, and W. As an example of such coatings the deposition of cubic TiAlN should be mentioned which could be deposited in it's pure cubic phase even up to a concentration of 70% and 80% percent of Al. Percentage is given with reference to the metallic content of the compound, i.e. $(Al_{0.7}Ti_{0.3})N$ or $(Al_{0.8}Ti_{0.2})N$. The reactive element may be in a stoichiometric, sub- or over-stoichiometric concentration with reference to the metal composition.

FIGURES

Figure 2:
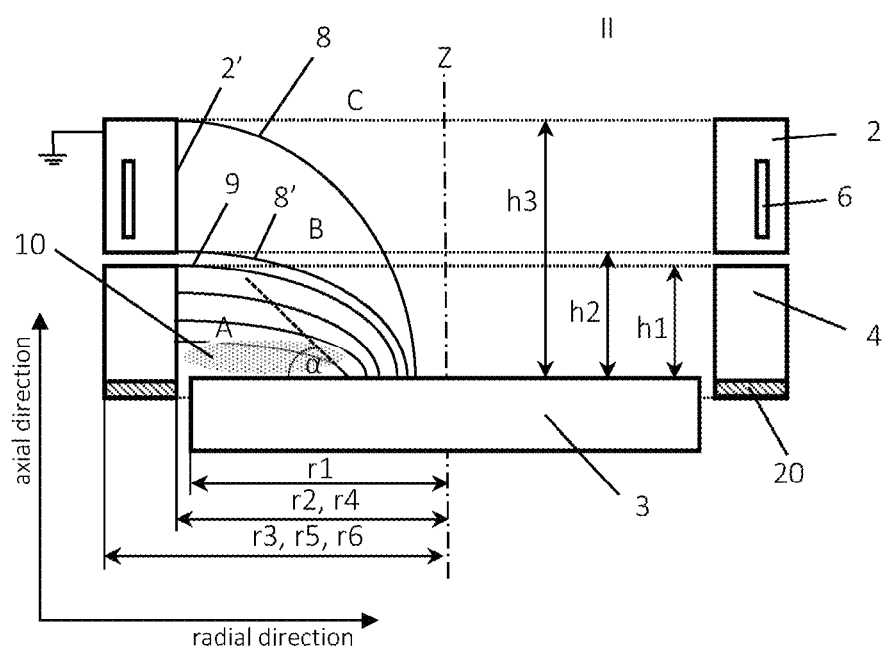
Figure 3:
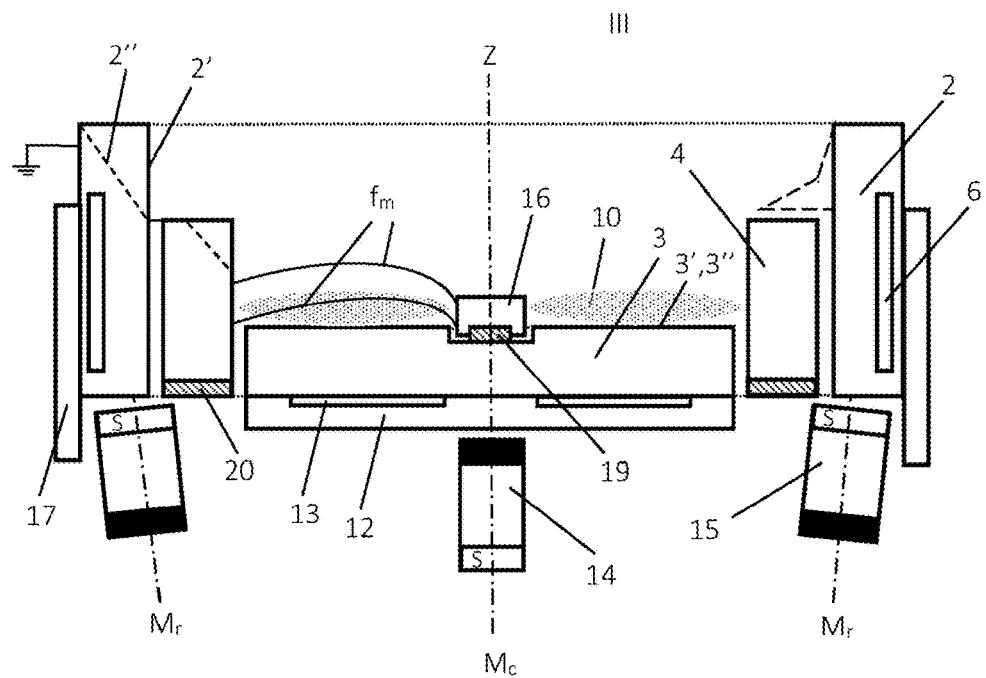
Figure 4:
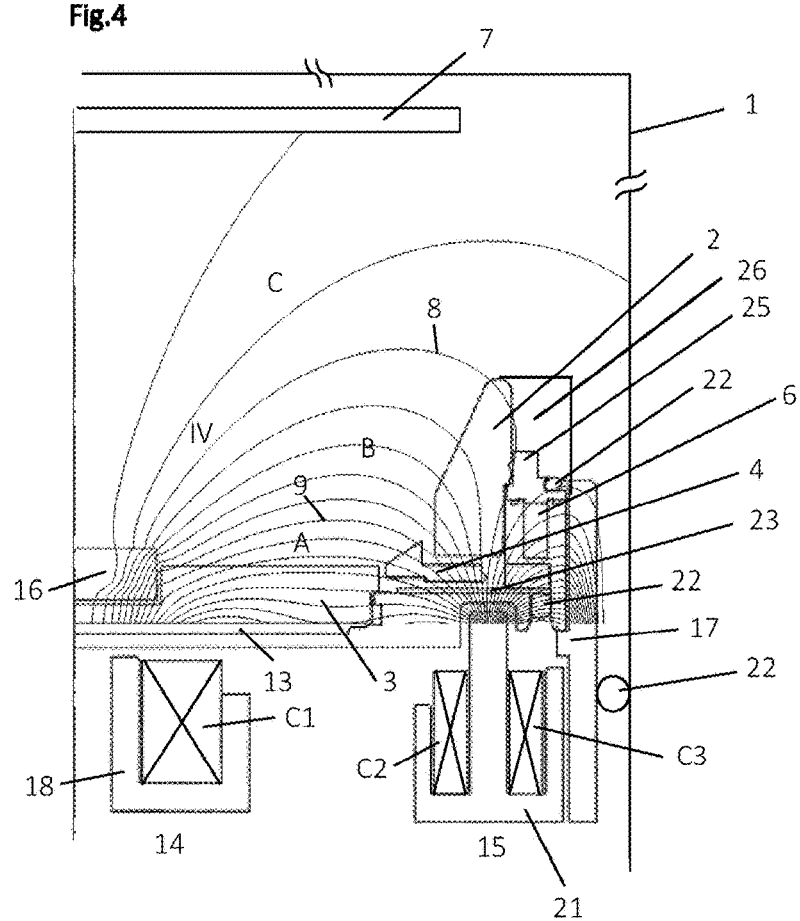

The invention shall now be further exemplified with the help of figures. The figures show:

FIG. 1: Schematically and simplified a first embodiment of the apparatus according to the invention;

FIG. 2: A second embodiment of the apparatus according to the invention;

FIG. 3: A third embodiment of the apparatus according to the invention;

FIG. 4: A fourth embodiment of the apparatus according to the invention;

FIG. 1 shows, most schematically and simplified, an embodiment of an arc source I according to the present invention, whereby a planar target 3 of radial width or diameter r1 and a respective confinement 4 encompassing the target, as well as an anode 2 encompassing both the target and the confinement. The target can be of polygonal, e.g. rectangular, or of circular shape and Z therefor defines a central plane or an axis of the target. In the following, for ease of understanding it is referred to circular and with reference to FIGS. 3 and 4 to ring-shaped targets, however such dimensions can be easily translated to other planar targets, i.e. targets having a planar surface to be evaporated, of different shapes which are also encompassed by the present invention. Due to the nested construction of the arc source from FIG. 1, which also refers to FIG. 3 and FIG. 4, the inner diameter r2 of the confinement will be usually larger than the outer diameter r1 of the target 3, or at least larger than the outer diameter of the active target surface 3', e.g. when the confinement is construed to protrude the target surface for a few millimeters (not shown) and form an arc extinguishing distance in an upward instead of a sidewise direction as shown in the figures. Such a distance, here r2-r1 should be in the range from 1.5 to 3 mm to ensure that electric arcs running on the surface of the target can neither creep into the gap formed between the target and the confinement nor expand to the confinements surface. At the same time occurrence of undesirable parasitic plasmas within the gap can be avoided. Similar distances can be chosen for the distance r4-r3 between the outer diameter r3 of the confinement 4 and the inner diameter r4 of the anode, or the respective axial distance h2-h1 of the confinement 4 to the anode 3 as shown in FIG. 2 or with a variation of the anode shape 2''' as shown in FIG. 1 with dashed lines. Thereby electric contact as well as undesirable plasma formation between the electrically isolated confinement and the anode can be effectively avoided.

In the region where magnetic field lines enter the target surface in an acute angle of $\alpha \leq 45°$, the so called active surface 3', an electric arc can be ignited and circularly steered by the radial magnetic field. Thereby an intensely shining plasma 10, (hereafter also called reactive gas plasma, can be formed by which reactive gas molecules, like nitrogen, oxygen, or carbon containing gases entering this zone can be effectively dissociated into its atomic, respectively ionic components and therewith help to react a metallic active target surface or metallic ions or clusters departing from the arc running on the surface. Thereby a great part of the possible reactive plasma processes, like nitridation, oxidation, carburization or processes with mixed reactive gases can happen at or near the target surface within zone A which is in the region between the last magnetic field line 9 still entering the confinement and the target surface 3, especially the active target surface 3' which is formed at an outer surface region with embodiments as shown with FIG. 1 and FIG. 2. Zone A can also be seen as an electron trap as electrons are supposed to be reflected from the confinement walls and can escape from the plasma only when they arrive at zone B between field line 9, respectively 8' and field line 8, whereat field line 8 enters the electron receiving surface at its highest or outermost border and field line 8' enters the electron receiving surface at its lowest or innermost border, which is immediately above field line 9, see also FIG. 2. In zone B electrons will be neutralized at the anode 2. The electron receiving surface 2', 2'', 2''' of the anode 2 can be formed geometrically different, e.g. simply cylindric 2', and/or as e.g. differently sloped against axis Z as shown with dashed lines 2'', or in a way protruding over at least a part of the confinement 4 as shown with dashed lines at 2''' in FIG. 1. The anode is further provided with an anode cooling channel 6', which can be connected to a dedicated or common, e.g. water based cooling line, not shown in the figures.

Similar to the electron receiving surface defined by an inner and/or an upper surface of the anode, the inner and/or upper surface of the confinement 4 can be formed geometrically different, e.g. simply cylindric 4', and/or e.g. at least in parts differently sloped against axis Z as shown with dashed line 4'', or protruding the target surface as shown with dashed lines 4'''.

All inventive arc sources are further provided with a magnetic guidance system adapted to provide a magnetic field in front of the target surface being essentially in parallel to at least an outer region of the target surface as with embodiments show in FIG. 1 and FIG. 2 or even over the whole target surface as with embodiments as shown in FIG. 3 and FIG. 4. Essentially in parallel hereby means that magnetic field lines enter the active target surface in an acute angle $\alpha \leq 45°$, or even more acute with $\alpha \leq 30°$, or $\alpha \leq 25°$. Such magnetic guidance systems as shown in an exemplary manner in FIG. 3 and FIG. 5 can also be used with any other embodiments, e.g. with embodiment 1 and 2 of the inventive arc source, and will usually comprise a central magnet 14 and a ring-magnet 15, the latter encompassing the central magnet and facultatively the target 3 at least in prospect. A ferromagnetic peripheral yoke 17 on ground potential may also help with any embodiment to further form the magnetic field, e.g. to limit the extension of the magnetic field lines in a radial direction.

FIG. 2 shows an inventive embodiment of an arc source II with a cylindrical anode 2 arranged on top of a cylindrical confinement, both of the same inner diameter. In this case essentially only distance h2 will contribute to the raise of the discharge voltage of the arc source, whereas in any other embodiments as shown in other figures axial distance h1 or h2 and radial distance r5-r2 will contribute. The latter distance is nearly neglectable with FIG. 2 as being reduced to the gap between the target and the confinement.

In another embodiment, which is not shown in the figures, the confinement is formed as a ring encompassing the target at target surface level, and the anode is formed as a ring encompassing both at the same level. In this case essentially only radial distance r4-r1 will contribute to the raise of the discharge voltage of the arc source, when inner confinement surfaces 4', 4'', 4''' and inner electron receiving surfaces are replaced completely by respective upper confinement and anode surfaces, when arranged at the same level as the target surface 3.

FIG. 3 shows an arc source III similar to FIG. 1 having a basic magnetic guidance system with a central permanent magnet 14 having its magnetic axis $M_c$ in line with central axis Z, whereas the magnetic axis $M_r$ of the ring magnet 15 is tilt away from the central axis Z, or plane Z in an upwards direction. The angel of tilting of the magnetic axis $M_r$ against central axis Z can be between 0 and 45°, e.g. between 5 and 30° up to the respective situation. Therewith also the magnetic separatrix can be influenced, respectively tilted whereby a flatter or more parallel course of the field lines above the target surface can be reached. In this context the separatrix is the plane between magnetic field lines running on the one hand from one pole, here the south pole of the ring-magnet to the counter pole, here the north pole of the central magnet and on the other hand magnetic field lines running from the one pole of the ring-magnet to the counter pole of the same ring-magnet. A man of the art will recognize that magnetic poles can be swapped in opposition. A ferromagnetic peripheral yoke 17, e.g. on anode potential, which usually is ground potential, can be used also to make the field lines more parallel above the target surface and to block the magnetic field in a radial direction outside the peripheral yoke which encompasses the whole arc source sidewise. With FIG. 3 central magnet 3 is arranged immediately under the target back plate 12, which comprises a target cooling channel which can be connected to a dedicated or common, e.g. water-based cooling line, not shown in the figures. Alternatively, the central magnet could be also placed within the backplate 12, e.g. within the cooling channel 13.

Further on an arc source of type III or IV, see below with FIG. 4, comprises a ferromagnetic central limiter 16 on electrically floating potential at or in the center of the target 3. Therefor yoke 16 is mounted on an isolator 19 of electrically isolating and heat resistant material, like ceramics, similar to the as floating mounted confinement 4 which is mounted with the help of at least one electrically isolator 20. The gap between the central limiter 16 and the target should be in the dimensions as mentioned above with the confinement 4, that is be in the range from 1.5 to 3 mm.

With the help of the central limiter 16 symbolically shown magnetic field lines $f_m$ can be formed essentially in parallel to the whole target surface 3'. Thereby also the active target surface 3" can expand over the whole surface 3', in this case a surface ring. Due to the high heat load in the middle of the target any central limiter 16 for any embodiment must be made of magnetic material having a high Curie-temperature $T_C$ preferably over 600° or higher. Permeability $\mu_r$ of such materials should be at least higher 100 or even higher 500, the saturation magnetization should be higher 0.3 Tesla, or even higher 0.5 Tesla. Such materials should also have a low remanence $B_r$, especially if magnetic steering of the arc should involve dynamic magnetic fields, e.g. when magnetic coils are driven with a variable, e.g. pulsed current respective coercive filed strength $H_C$ should be below 200 A/m or even equal or below 50 A/m.

Examples of such materials are pure iron like ARMCOR iron having a $T_C$ of 766° C., construction steels having a low content of carbon like S235 or S355 steel having a $T_C$ of about 768° C., or ferritic corrosion resistance steels having a chromium content higher 10.5%, e.g. from 17.25 to 18.25 according to ASTM A838-02 (2007) having a $T_C$ of 671° C. with a low Si concentration from 0.30 to 0.70 mass %, or having a $T_C$ of 660° C. with a higher Si concentration from 1.00 to 1.50 mass %. Magnetic properties of the peripheral yoke 17 should be the same however as this yoke is away from the hot target surface also austenitic steels having respective properties and other more inexpensive magnetic material can be used having a much lower Currie temperature.

As with FIG. 3 an arc source with a ferromagnetic central limiter is shown in FIG. 4, here within a most simplified and schematically vacuum chamber 1 having a substrate 7 mounted above the arc source IV. Contrary to the arc source of type III in FIG. 3 using permanent magnets the magnetic guidance system of the arc source of type IV makes use of electromagnets C1, C2, C3, whereat magnet 14 is realized by electromagnetic coil C1 with a central coil yoke 18, and ring-magnet 15 is realized by coils C2 and C3 and outer coil yoke 21.

FIG. 4 shows a realized industrial set up of an inventive arc source type IV with an electromagnetic guidance system and so do magnetic field lines refer to actual field lines which can be produced with such a system as a superposition of fields $H_{C1}$, $H_{C2}$ and $H_{C3}$ produced by coils C1, C2 and C3. Wherein central magnet 14 comprises electromagnetic coil C1 and central coil yoke 18 and ring-magnet 15 comprises electromagnetic coils C2, and C3, and outer coil yoke 21. To produce such a field magnetic axis $M_r$ and respective separatrix of the ring-magnet 15 has been tilt away from central axis Z in an upwards direction by applying a higher current to C2 than to C3, which means $I_{C2} > I_{C3}$. Alternatively, such an effect can also be produced by feeding the same current to coils of different windings N, e.g. $N_{C2} > N_{C3}$. The anode is a two part anode having an anode body 25 with cooling channel 6 and an inner ring-like extension 26. Vacuum seals 22 tighten the vacuum chamber 1 against ambient air and water from the cooling circuit(s) 6, 13. Substrates 7 can be mounted to substrate supports (not shown) in a known e.g. rotating manner. Zones A, B and C are about separated from each other by field lines 8 and 9 as depicted. With such a construction a lean arc source having an outer diameter of 220 mm could be realized with a target diameter of 130 mm and a ferromagnetic central limiter of 36 mm. Total height from the backside of the target 3 to the upper border of the electron receiving surface 2 was about 53 mm.

In an industrial environment using an Oerlikon batch coating equipment providing a coating height of 1000 mm up to 24 type IV arc sources could be installed in four rows each row comprising 6 arc sources per meter one above the other whereby hard coatings of the AlMeN and AlMeNO type could be deposited with a high rate and a high aluminum content on different substrates. With an aluminum content from zero to 85%, especially with high aluminum concentrations between 70 and 85%, e.g. in combination with at least one of Ti and Cr, pure cubic phase compounds could be deposited. The chamber diameter of such equipment is 1000 mmm, having a carrousel of 700 mm diameter and a chamber height of 2000 mm. Substrates where mounted with 1-, 2- and 3-fold rotation, nearest substrate to target distance was about 300 mm. Similar tests have been performed with further industrially available coating systems of the Innova and Innoventa type of the applicant. Thereby industrial applicability could be tested for the following chamber dimensions: diameter of chamber 500-1200 mm, diameter of carousel 300-900 mm, chamber height 1000-2000 mm, with a usable coating height of 500-1500 mm.

In the following properties and geometric data of certain core components of an inventive arc sources are listed:

Target: can be cooled directly or via a bonded backplate depending on respective material strength. Both types can be mounted on a water-cooled cathode electrode;
  circular diameter $D_T$, 60 mm≤$D_T$=2r1≤200 mm; 100 mm≤$D_T$=2r1≤150 mm;
  material: any solid material adapted for arc evaporation.

Confinement: is mounted isolated between the target and the anode whereby a potential between the cathodic target potential and the positive or grounded anode potential is induced during the cathodic arc process.
  inner diameter $D_{CI}$, 95≤$D_{CI}$=2×r2≤155 mm; e.g. 132 mm
  thickness $t_{CR}$ in radial direction (r3−r2), 10≤$T_{CR}$≤30 mm; e.g. 148 mm; it should be mentioned that thickness tor only refers to the surface area of the confinement ring which can be exposed to the arc-plasma, whereas the total thickness extension of the confinement ring can be larger due to construction features of a specific arc source, e.g. when an anode extension overlaps and thereby protects an outer part of the confinement ring against interaction with the plasma.
  distance h1 from the active surface to an upper surface or the top of the confinement ring 0 (for a planar embodiment)≤h1≤20, preferred ranges for cylindric and combined embodiments, e.g. FIGS. 1 to 4, 10≤h1≤30, e.g. 15≤h1≤25;
  the radial distance of the confinement ring, at least in the region where the confinement ring encompasses the target in a target plane will be usually defined by a distance $d_D$=r3−r2=r4−r5=h2−h1, for which is valid 1.5 mm≤$d_D$≤3 mm; thereby expanding of the arc spot to the confinement as well as parasitic plasmas between components of the source are prevented as this distance complies with a dark room distance with usual process pressures;
  material: ferromagnetic material like iron, carbon steel or the like but also non-magnetic metals having a melting point high enough to withstand the high thermal load of the neighboring arc discharge, e.g. stainless steel.

Anode: internally water-cooled is set on a positive potential or on ground potential;
  inner diameter $D_{AI}$, which also defines the inner diameter of the electrode receiving surface 80 mm≤$D_{AI}$=2×r4≤220 mm, 120 mm≤$D_{AI}$=2×r4≤170 mm or about 150 mm;
  thickness $t_{AR}$ in radial direction, 10≤$T_{AR}$≤40 mm;
  distance h2 from the active surface to an electron receiving surface or the top of the confinement ring 0 (e.g. for a planar embodiment)≤h1≤50, preferred range for cylindric and combined embodiments 10≤h1≤35; h2 can be the same as h1 when confinement is nested within the anode, e.g. when the anode has an electron receiving surface 2', 2" according to FIGS. 1 and 3.
  material can be copper, carbon steel or stainless steel.

Total geometry of the cathode assembly
  diameter in the range of 150 mm (e.g. for a zylindric modification)≤DSource≤290 mm (e.g. for a planar modification), or 180 mm≤DSource≤260 mm Magnetic guidance system to generate a magnetic field having a high parallel component at least near above an outer region of the active target surface. The means comprising a guidance system placed in front of the back surface of the target, e.g. on the backplate of the cathode electrode and electrically isolated against the electrode. The guidance system can be optionally assisted by a ferromagnetic central limiter, which is mounted electrically isolated (on floating potential) in the center of the target surface and/or a peripheral yoke.

Ferromagnetic central limiter:
  circular diameter $D_Y$, 15 mm≤$D_Y$≤50 mm; e.g. 36 mm
  material: pure iron, construction steel of low carbon content, ferritic corrosion resistant steel, details see above Magnetic field which can be set with the inventive source:
  should be essentially in parallel at and near the active target surface at least for an outer region of the active target surface;
  formation of three zones (A, B, C) during cathodic arc processes possible with magnetic flux density $B_A$>$B_B$>$B_C$, details see above;

The arc source supply can be a DC supply delivering discharge currents e.g. from 10 to 200 A, e.g. 40 to 120 A per source. Alternatively, a pulsed arc supply or a DC-supply with a superimposed pulse supply can be used.

Contrary to state of the art sources which are driven with a discharge voltage between 12 and 20 V, the present source can be driven with a discharge voltage between from 20 to 50 V, e.g. from 25 to 40 V or from 30 to 35 V due to the higher resistance of the electron trap which can be formed in zone A due to the geometry, materials and magnetic means of the present arc source.

Finally, it should be mentioned that a combination of features mentioned with one embodiment, example or type of the present invention can be combined with any other embodiment, example or type of the invention unless being in contradiction.

REFERENCE NUMBERS 1 vacuum chamber
2 anode
2', 2", 2''' electron receiving surface of the anode
3 target
3' target surface
3" active target surface
4 confinement on electrical floating potential
4', 4", 4''' inner surface of the confinement
5 arc discharge supply
6 cooling channel anode
7 substrate (biased/non biased)
8, 8' magnetic field line to anode
9 magnetic field line to confinement
10 gas plasma
11 gas inlet ($N_2$, $O_2$, $CH_4$, $C_2H_2$, Ar)
12 target back plate
13 cooling channel back plate
14 central magnet
15 ring-magnet
16 ferromagnetic central limiter electrically floating
17 ferromagnetic peripheral yoke on ground potential
18 central coil yoke
19 isolator for central limiter
20 isolator for confinement
21 outer coil yoke
22 seal
23 electric isolator for target
24 anode base
25 anode extension 26 part of the chamber or component of the chamber or within the chamber, e.g. a flange or a part of a flange that is preferably electrically connected to the anode, so that they are at the same potential C1, C2, C3 electromagnetic coil 1, 2, 3 h1 axial distance from the active surface 3' to an upper border of the confinement 4;

h2 axial distance from the active surface 3' to a lower border of the electron receiving surface 2', 2", 2''', can be the same as h1, see e.g. FIG. 2 left side electron receiving surfaces 2', 2";

h3 axial distance from the active surface 3' to the upper border of the electron receiving surface 2', 2", 2''';

M magnetic axis r1 radial distance from central axis for a circular target 3 or radial distance from central plane for a polygonal, e.g. rectangular target 3;

r2 radial distance from central axis/plane to inner diameter/border of confinement 4;

r3 radial distance from central axis/plane to outer diameter/border of confinement 4;

r4 radial distance from central axis/plane to inner diameter/border of electron receiving surface 2', 2", 2''';

r5 radial distance from central axis/plane to outer diameter/border of electron receiving surface 2', 2' ', 2'''';

r6 radial distance from central axis/plane to outer border of the arc source;

Z central plane or axis for polygonal respectively circular targets

Concretely, the present application relates to a cathodic arc evaporation apparatus comprising:
  a target as cathode having
    a front-target surface of a material to be evaporated, i.e. the active target surface,
    a back-target surface, parallel to the front-target surface but facing a target back plate placed in the opposite side in relation to the front-target surface, and
    a side-target surface connecting the front-target surface with the back-target surface,
  an electrically floating confinement located adjacent, preferably surrounding or at least partially surrounding the side-target surface, the confinement comprising an inner surface and an outer surface, wherein the side-target surface is closer to the inner surface of the confinement than to the outer surface of the confinement.
  an electrode as anode having an inner surface for acting as electron receiving surface,
  a magnetic guidance system adapted to provide magnetic fields comprising magnetic field lines located in front of the front-target surface,
  wherein:
  the inner surface of the confinement is placed:
    between the front-target surface and the electron receiving surface of the anode, if the distance in a perpendicular plane in relation to the front-target surface is considered, and/or
    between the side-target surface and the electron receiving surface of the anode, if the distance in a parallel plane in relation to the front-target surface is considered, and
  the magnetic guidance system designed and adjusted for producing at least following two magnetic fields regions:
    a first region comprising magnetic field lines located in front of the front-target surface which exit the front-target surface and end in the inner surface of the confinement member, and
    a second region comprising magnetic field lines located in front of the front-target surface which exit the front-target surface and end in the electron receiving surface of the anode, The apparatus preferably comprising a ferromagnetic central limiter electrically floating (16) for modifying the trajectory of the magnetic fields lines that exit the front-target surface in order to make them essentially parallel to the plane of the front-target surface.

The present invention refers also to a method for operating the inventive apparatus, wherein during operation of the apparatus within a vacuum chamber, three plasma zones or plasma regions are produced, wherein:
  a first plasma zone comprises electrons crossing the magnetic fields without having access to the anode, because of the magnetic field lines that exit the front-target surface and end in the inner surface of the confinement member,
  a second plasma zone, in which electrons are drifted to the anode by the magnetic field lines that exit the front-target surface and end in the electron receiving surface of the anode, and
  a third plasma zone, in which there are not any magnetic field lines which neither exit the front-target surface and end in the inner surface of the confinement member nor exit the front-target surface and end in the electron receiving surface.

The electron temperature by applying the above mentioned method if preferably:
  between 1 eV und 5 eV in the first plasma zone, and
  between 0.3 eV und 1 eV in the second and third plasma zone.

Preferably the inventive method comprises at least one step in which a reactive gas is introduced in the vacuum chamber and the apparatus is operated while the reactive gas is introduced in the vacuum chamber, wherein the first plasma zone comprises more reactive gas ions than the second plasma zone and the third plasma zone, consequently the reactive gas ion density in the first plasma zone being higher than the reactive gas ion density in the second and third plasma zones.

In a preferred embodiment of the method the target or at least the front-target surface is made of a metallic material and the reactive gas react with the metallic material from the target producing a layer comprising elements from the reactive gas as well as elements from the metallic material.

According to a further preferred embodiment the target consists of or comprises Ti or Al or Al and Ti, and the reactive gas is nitrogen or comprises nitrogen, so that the layer resulting from the reaction of reactive gas with metallic material from the target is a nitriding layer consisting of or comprising TiN or AlN or AlTiN, respectively.

According to one more preferred embodiment the target material is selected consisting of or comprising Al and Ti in a concentration allowing the synthesis of a coating on a substrate placed in the third plasma zone, which consists of or comprises cubic aluminum nitride having element composition $Al_xTi_{1-x}N$ with x as atomic concentration fraction of Al, wherein X is 0.8.

In a more detailed embodiment of the inventive cathodic arc evaporation apparatus, it comprises
  a target (3) which has a target surface (3') comprising an active surface (3") from where material can be evaporated in a cathodic arc process;

a confinement (4) surrounding an outer border of the target surface (3');
an anode (2) having an electron receiving surface (2', 2", 2"'), the anode (2) encompassing at least one of the target (3) and the confinement (4) in at least one of a target plane and an axial distance in front of the active surface;
a magnetic guidance system adapted to provide a magnetic field at the target surface being essentially in parallel to at least an outer region of the target surface so that magnetic field lines are in parallel to the target surface or inclined to it in an acute angle α, whereat an active surface (3") is defined in a surface (3') area where magnetic field lines enter the target surface in an acute angle $\alpha \leq 45°$;
a central axis Z or a central plane Z'; wherein the confinement (4) and the anode (2) both are made in closed geometry and both are electrically isolated against each other and the target, whereat the minimum distance of the electron receiving surface (2', 2", 2"') from the active surface (3") is defined by at least one of a radial distance $\Delta r_{14}$ of an outer border of the target surface (3') to an inner border of the electron receiving surface, whereby the outer border of the target surface (3') has a radial distance r1 from the middle of the target and the inner border of the electron receiving surface has a radial distance r4 from the middle of the target, and an axial distance h1 from the target surface (3') to an upper border of the confinement or an axial distance h2 from the target surface (3') to a lower border of the electron receiving surface (2', 2"', 2"').

The inventive apparatus according to any of the preferred embodiments described above is preferably adjusted so that essentially parallel magnetic field extends from the active target surface (3') at least to an axial distance (h1, h2) of the confinement or the electron receiving surface, and/or extends at least to a height of 5 to 20 mm above the target surface.

In the zone A above the active target surface, the strength of the magnetic flux density $B_A$ can be set from 20 to 500 Gauss or even higher.

The confinement can be made of magnetic or non-magnetic material.

Preferably the radial distance $\Delta r_{14}$ is from 5 to 30 mm.

Preferably the radial distance r1 of the outer border of the target surface from the center of the apparatus is from 40 to 110 mm.

Preferably the axial distance (h1, h2) is from 0 to 20 mm.

Preferably a maximum axial distance h3 of the electron receiving surface is: $10 \leq h3 \leq 50$.

Preferably the magnetic guidance system comprises at least a central magnet having a pole placed in front of a center of a back surface of the target and being axially aligned to it, and a peripheral ring magnet having a reciprocal pole in or below a target plane, the ring magnet in prospect encompasses the central magnet and at least a part of the target.

Preferably at least one of the central magnet and the ring-magnet is an electromagnet or a permanent magnet.

Preferably the magnetic axis of the ring-magnet is tilt away from the central axis Z or plane Z' in an upwards direction.

In a preferred embodiment the ring-magnet comprises two electromagnetic coils C2 and C3, whereby the diameter of C3 is larger than the diameter of C2.

In a further preferred embodiment, the magnetic guidance system further comprises a peripheral yoke encompassing the ring-magnet, the target and the anode, the peripheral yoke being made of magnetizable material.

Preferably the magnetic guidance system further comprises a central limiter arranged in or round the center of the target surface, the central limiter being electrically isolated against the target and made of magnetic material having a Curie-temperature $T_C > 500°$ C.

In a preferred embodiment the central limiter protrudes 0 to 20 mm above the target surface or to an axial distance h1 or h2.

In a further preferred embodiment, the central limiter is in a plane with the target surface.

In a preferred embodiment the confinement is made of non-magnetic material.

In a further preferred embodiment, the minimum distance of the electron receiving surface (2', 2", 2"') from the active surface (3') is defined by the radial distance $\Delta r_{14}$ and the axial distance h1 or h2.

The present invention also relates to a vacuum chamber comprising an inventive cathodic arc evaporation apparatus according to any one of the above-mentioned inventive embodiments.

The present invention relates also to a method to deposit a coating on a substrate in a vacuum chamber by use of a cathodic arc evaporation apparatus according to one of claims 1 to 18, whereat an electron trap is established immediately above a target surface within zone at least A by applying an essentially parallel magnetic field, with magnetic field lines entering the target surface in an acute angle $\alpha \leq 45°$, to at least an outer region of the target surface (3) by use of a magnetic guidance system, whereby an active surface (3") is formed, and a cathodic arc discharge is ignited and maintained on the active surface, whereat zone A is sidewise delimited by a confinement on floating potential.

Preferably the zone B is formed above zone A to about an axial distance h3, given by the maximum axial distance of the electron receiving surface from the target surface.

Preferably the zone C is formed above zone A and B, wherein the magnetic field is very low or zero and the atmosphere comprises reactive gas molecules and at least one of positively ionized metallic ions, and positively ionized reacted metal ions.

In a preferred embodiment of the inventive methods described above, the cathodic arc discharge is maintained at a discharge voltage between 20 V to 50 V.

In a preferred embodiment of the inventive method, the coating is an AlMEN, an AlMeO or an AlMENO compound, where Me stands for one or more metals of the transition metal group IV, V or VI.

The present invention relates also to a method to produce a coated substrate by a deposition process according to any one of the inventive embodiments described above.

In a preferred embodiment the coated substrate is a tool or a component.

What is claimed is:
1. Cathodic arc evaporation apparatus comprising:
a planar target as cathode having a front-target surface, comprising an active target surface where magnetic field lines enter the active target surface in an acute angle $\alpha \leq 45°$;
a back-target surface, parallel to the front-target surface but facing a target back plate placed in the opposite side in relation to the front-target surface;
a side-target surface connecting the front-target surface with the back-target surface;

an electrically floating confinement located adjacent and comprising an inner surface and an outer surface, wherein the side-target surface is closer to the inner surface of the confinement than to the outer surface of the confinement;

an electrode as anode having an inner surface for acting as electron receiving surface; and a magnetic guidance system adapted to provide magnetic fields comprising magnetic field lines located in front of the front-target surface, wherein the inner surface of the confinement is placed:
  between the front-target surface and the electron receiving surface of the anode, the distance considered in a perpendicular plane in relation to the front-target surface, and/or
  between the side-target surface and the electron receiving surface of the anode, the distance considered in a parallel plane in relation to the front-target surface, wherein the magnetic guidance system is designed and adjusted for producing the following magnetic fields regions:
  a first region comprising magnetic field lines located in front of the front-target surface which exit the front-target surface and end in the inner surface of a confinement member, and/or
  a second region comprising magnetic field lines located in front of the front-target surface which exit the front-target surface and end in the electron receiving surface of the anode, and wherein the magnetic guidance system comprises:
  a central magnet having a pole placed in front of a center of a back surface of the target and being axially aligned to the target, and a peripheral ring magnet having a reciprocal pole in or below a target plane, the ring magnet in prospect encompasses the central magnet and at least a part of the target, and
  a peripheral yoke encompassing the ring magnet, the target and the anode, the peripheral yoke being made of magnetizable material.

2. Apparatus according to claim 1, wherein the apparatus comprises a ferromagnetic central limiter arranged in or around the center of the target surface, the central limiter being electrically floating for modifying the trajectory of the magnetic fields lines that exit the front-target surface in order to make them essentially parallel to the plane of the front-target surface.

3. Method for operating the apparatus according to claim 1, wherein during operation of the apparatus within a vacuum chamber, three plasma zones or plasma regions are produced, wherein:
  a first plasma zone comprises electrons crossing the magnetic fields without having access to the anode, because of the magnetic field lines that exit the front-target surface and end in the inner surface of the confinement member,
  a second plasma zone, in which electrons are drifted to the anode by the magnetic field lines that exit the front-target surface and end in the electron receiving surface of the anode, and
  a third plasma zone, in which there are not any magnetic field lines which neither exit the front-target surface and end in the inner surface of the confinement member nor exit the front-target surface and end in the electron receiving surface.

4. Method according to claim 3, wherein:
  the electron temperature in the first plasma zone is between 1 eV und 5 eV, and the electron temperature in the second plasma zone and in the third plasma zone is between 0.3 eV und 1 eV.

5. Method according to claim 3, wherein the method comprises at least one step in which a reactive gas is introduced in the vacuum chamber and the apparatus is operated while the reactive gas is introduced in the vacuum chamber, wherein the first plasma zone comprises more reactive gas ions than the second plasma zone and the third plasma zone, consequently the reactive gas ion density in the first plasma zone being higher than the reactive gas ion density in the second and third plasma zones.

6. Method according to claim 5, wherein the target or at least the front-target surface is made of a metallic material and the reactive gas react with the metallic material from the target producing a layer comprising elements from the reactive gas as well as elements from the metallic material.

7. Method according to claim 6, wherein the target comprises Ti or Al or Al and Ti, and the reactive gas is nitrogen or comprises nitrogen, so that the layer resulting from the reaction of reactive gas with metallic material from the target is a nitriding layer comprising TiN or AN or AlTiN, respectively.

8. Method according to claim 7, wherein the target material is selected comprising Al and Ti in a concentration allowing the synthesis of a coating on a substrate placed in the third plasma zone, which consists of or comprises cubic aluminum nitride having element composition $Al_xTi_{1-x}N$ with X as atomic concentration fraction of Al, wherein X is 0.8.

9. Cathodic arc evaporation apparatus according to claim 1, comprising
  the target which has a front-target surface comprising the active target surface from where material can be evaporated in a cathodic arc process;
  the confinement surrounding an outer border of the active target surface;
  the anode having the electron receiving surface, the anode encompassing at least one of the target and the confinement in at least one of a target plane and an axial distance in front of the active target surface;
  the magnetic guidance system adapted to provide the magnetic field lines at the front surface being essentially in parallel to at least an outer region of the front target surface so that the magnetic field lines are in parallel to the front target surface or inclined to it in the acute angle α, wherein the active target surface is defined in a surface area where the magnetic field lines enter the active target surface in the acute angle α≤45°;
  a central axis Z or a central plane Z';
  wherein the confinement and the anode both are made in closed geometry and both are electrically isolated against each other and the planar target; wherein the minimum distance of the electron receiving surface from the active target surface is defined by at least one of a radial distance $\Delta r_{14}$ of an outer border of the active target surface to an inner border of the electron receiving surface, whereby the outer border of the active target surface has a radial distance r1 from the middle of the target and the inner border of the electron receiving surface has a radial distance r4 from the middle of the target; and an axial distance h1 from the active target surface to an upper border of the confinement or an axial distance h2 from the active target surface to a lower border of the electron receiving surface.

10. Apparatus according to claim 1, wherein an essentially parallel magnetic field extends from the active target surface at least to an axial distance of the confinement or the electron receiving surface, and/or extends at least to a height of 5 to 20 mm above the target surface.

11. Apparatus according to claim 1, wherein a magnetic flux density $B_A$ is located in a zone A above the active target surface, the strength of the magnetic flux density $B_A$ can be set from 20 to 500 Gauss, wherein zone A is sidewise delimited by a confinement on a floating potential which encompasses the target and the center of the target by an inactive surface region of the target, where magnetic field lines enter the target surface in an angle >45° or by a central limiter, and zone A is delimited in an axial direction from the target by the last magnetic field line which enters the confinement at its upper border.

12. Apparatus according to claim 1, wherein at least one of the central magnet and the ring-magnet is an electromagnet or a permanent magnet.

13. Apparatus according to claim 1, wherein a magnetic axis of the ring-magnet is tilted away from a central axis Z or plane Z' in an upwards direction.

14. Apparatus according to claim 1, wherein the ring-magnet comprises two electromagnetic coils C2 and C3, whereby the diameter of C3 is larger than the diameter of C2.

15. Apparatus according to claim 1, wherein the magnetic guidance system further comprises a central limiter arranged in or round the center of the target surface, the central limiter being electrically isolated against the target and made of magnetic material having a Curie-temperature $T_C$>500° C.

16. Apparatus according to claim 15, wherein the central limiter protrudes 0 to 20 mm above the target surface or to an axial distance h1 or h2.

17. Apparatus according to claim 15, wherein the central limiter is in a plane with the target surface.

18. Apparatus according to claim 15, wherein the confinement is made of non-magnetic material.

19. Vacuum chamber comprising a cathodic arc evaporation apparatus according to claim 1.

20. Method to deposit a coating on a substrate in a vacuum chamber by use of a cathodic arc evaporation apparatus according to claim 1, wherein an electron trap is established at least immediately above the active target surface within a zone A by applying an essentially parallel magnetic field, with magnetic field lines entering the target surface in the acute angle $\alpha \leq 45°$, to at least an outer region of the active target surface by use of the magnetic guidance system, whereby the active target surface is formed, and a cathodic arc discharge is ignited and maintained on the active surface, wherein the zone A is sidewise delimited by the confinement on floating potential.

21. Method according to claim 20, wherein a zone B is formed above zone A to about an axial distance h3, given by the maximum axial distance of the electron receiving surface from the active target surface.

22. Method according to claim 20, wherein a zone C is formed above zone A and B, wherein the magnetic field is zero and the atmosphere comprises reactive gas molecules and at least one of positively ionized metallic ions, and positively ionized reacted metal ions.

23. Method according to claim 20, wherein the cathodic arc discharge is maintained at a discharge voltage between 20 V to 50 V.

24. Method according to claim 20, wherein the coating is an AlMeN, an AlMeO or an AlMeNO compound, where Me stands for one or more metals of the transition metal group IV, V or VI.

25. Method according to claim 20, wherein the substrate is a tool or a component.

26. Apparatus according to claim 1, wherein the electrically floating confinement is located surrounding or at least partially surrounding the side-target surface.

* * * * *